United States Patent [19]
Tchamov et al.

[11] Patent Number: 5,933,057
[45] Date of Patent: Aug. 3, 1999

[54] LOW NOISE AMPLIFIER

[76] Inventors: Nikolay Tchamov, Lindforsinkatu 21 A 17, FIN-33720, Tampere; Petri Jarske, Pirilänkuja 8 FIN-34240, Kämmenniemi, both of Finland

[21] Appl. No.: 08/873,310

[22] Filed: Jun. 11, 1997

[30] Foreign Application Priority Data

Jun. 11, 1996 [FI] Finland ..................................... 962420

[51] Int. Cl.$^6$ ................................................... H03F 3/191
[52] U.S. Cl. ............................................ 330/302; 330/311
[58] Field of Search .................................... 330/302, 305, 330/306, 310, 311

[56] References Cited

U.S. PATENT DOCUMENTS

| | | | |
|---|---|---|---|
| 3,805,164 | 4/1974 | Callaway | 330/310 X |
| 3,886,467 | 5/1975 | Watanabe et al. | 330/302 |
| 3,973,214 | 8/1976 | Rheinfelder | 330/305 |
| 4,890,069 | 12/1989 | Duffalo et al. | 330/311 X |

FOREIGN PATENT DOCUMENTS

| | | |
|---|---|---|
| 0 467 450 A1 | 1/1992 | European Pat. Off. . |
| 2 254 158 | 12/1974 | France . |

OTHER PUBLICATIONS

O.V. Golovin and I. Khardon Agilar, "Methods of Improving Amplifier Linearity in Professional SW Receivers", Telecommunications & Radio Engineering, vol. 38/39 (1984), Jan., No. 1, Silver Spring, MD, USA, pp. 69–74.

*Primary Examiner*—Steven J. Mottola
*Attorney, Agent, or Firm*—Scully, Scott, Murphy & Presser

[57] ABSTRACT

The invention relates to a low noise amplifier comprising an input stage and an output stage. The input matching and amplification of the amplifier are carried out by means of a common-base amplifier stage in a first cascade. An additional improvement is the use of a White's cascode with a high input impedance as a second stage of the cascade for matching the high output impedance of the common-base stage. The White's cascode also has a very low and stable output impedance, which serves the output matching very well. Furthermore, both stages have been so modified according to the invention that the collectors of their amplifier transistors are connected to the operating voltage by means of coils instead of resistors.

6 Claims, 3 Drawing Sheets

LOW NOISE AMPLIFIER

The invention relates to low noise amplifiers, especially in the microwave range (>1 GHz).

BACKGROUND OF THE INVENTION

New portable wireless communications systems have recently increased the demand of electronics circuits, such as RF-amplifiers, mixers and local oscillators related to various transmitters and receivers. Typically, they are implemented in form of integrated circuits. An important field are low noise amplifiers LNA. Prior art integrated circuits within the RF range are e.g. disclosed in:

[1] Robert G. Meyer, "A 1-GHz BiCMOS RF Front-End IC", IEEE Journal of Solid State Circuits, Vol. 29, No. 3, March 1994, p. 350–355.

[2] Asad A. Abidi, "Low-Power Radio-Frequency IC's for Portable Communications, Proceedings of the IEEE, Vol. 83, No. 4, April 1995, p. 544–569.

Recently, various kinds of two-stage circuit configurations have been introduced for low noise amplifiers LNA. Very frequently, topologies consisting of a cascade connection of a common-emitter amplifier stage and another stage are preferred. In most cases, cascade connections are based on the gain developed by the common-emitter stage. On the other hand, it is well known that the common-emitter connection suffers heavily from the Miller effect. The Miller effect is often reduced by loading the common-emitter stage with a low input impedance of a common base circuit used as a second stage of the cascade. In practice, this reduces the overall gain a great deal. In brief, such configurations suffer from the difficulty in matching up the high internal input and output impedances of the different stages of the cascade.

BRIEF SUMMARY OF THE INVENTION

It is an object of the present invention to provide a new low noise amplifier that is operable at higher frequencies, exhibits a higher gain and a lower power consumption than the prior art amplifier configurations.

The invention relates to an amplifier comprising an input stage and an output stage. The amplifier is characterized in that the input stage comprises a common-base connected amplifier component whose collector is connected to the operating voltage by means of a first inductive component, the output stage comprises a White's cascode in which a collector of one amplifier component is connected to the operating voltage with a second inductive component.

According to the present invention, the input matching and the amplification of the amplifier are provided by using a common-base amplifier stage as a first stage in the cascade. A further improvement is the use of a White's cascode with a high input impedance as a second stage of the cascade for matching the high output impedance of the common-base stage. The White's cascode also has a very low and stable output impedance, which serves the output matching very well. Furthermore, both stages have been so modified according to the invention that their collectors are connected to the operating voltage by means of inductive components instead of resistors. Due to an inductive component, such as a coil used in the collector circuit, the common-base stage has a higher gain, a lower voltage of the power supply as well as frequency selective characteristics. An improved capacity will be achieved even in a case where on-chip coils with a relatively low Q factor are employed.

The use of inductive components in a collector circuit according to the invention provides designers with more flexibility in securing a high gain. This, again, indirectly provides more freedom for design; once being released from the need to produce a sufficient gain, the designer is more free to choose the emitter current to match with the low noise. A high temperature stability and a low noise are achieved by selecting a sufficiently high emitter resistance and by employing a low-resistance divider for producing the base bias current. The value of the biasing resistor of the base circuit of the following White stage, the value being AC connected parallel with the inductive component of the collector of the first stage, can provide additional capacity for tuning the bandwidth of the amplifier. The use of an inductive component with a high Q factor in biasing the base of the White-stage would not provide better results. On the contrary, it would cut down the tuning band, on which the voltage gain remains nearly constant.

Employing an inductor with a low Q factor in the collector of an upper transistor in the White's cascode enhances the loop gain and brings the performance of the circuit a lot closer to ideal as it has a negative feedback of almost exactly 100%. This, in turn, results in an output impedance of almost zero, making the circuit an almost ideal output stage. The output is thus provided from the standard characteristic impedance (generally the resistance of 50 Ω). The biasing used assumes higher resistances and thus does not have any effect on the final Q factor of the inductive component in practice.

Frequency tuning may be pre-set e.g. by changing a DC blocking capacitor between the common-base stage and the White's cascode. This will have an effect on the interference level of the input impedance of the second stage which loads the first stage, thus changing the overall gain.

On the other hand, it is possible to tune the gain independently by changing the grounding capacitance of the common-base stage in order to produce exactly the overall gain required.

BRIEF DESCRIPTION OF THE DRAWINGS

In the following, the invention will be disclosed by means of preferred embodiments with reference to the associated drawings, in which.

DETAILED DESCRIPTION OF THE INVENTION

The present invention is well suited for implementing a low noise amplifier using various manufacturing technologies and types of components. Although NPN bipolar transistors are employed in the amplifier shown in FIGS. 1 and 2, any kind of amplifier components, such as MOS, CMAS, SOI, HEMT and HPT transistors, microwave tubes and vacuum tubes may be employed in the circuit configurations of the invention. In these components, the terminology related to the electrodes may vary. The main electrodes of a bipolar transistor are a collector and an emitter, and the driving electrode is termed as a base. In FET transistors, the corresponding electrodes are the drain, the source and the gate. In the case of vacuum tubes, the corresponding transistors are referred to as the anode, the cathode and the gate. Hence, the terms emitter, collector, base and common-base stage must herein be understood as broader terms covering the electrodes of other types of amplifier components.

Figure 1:
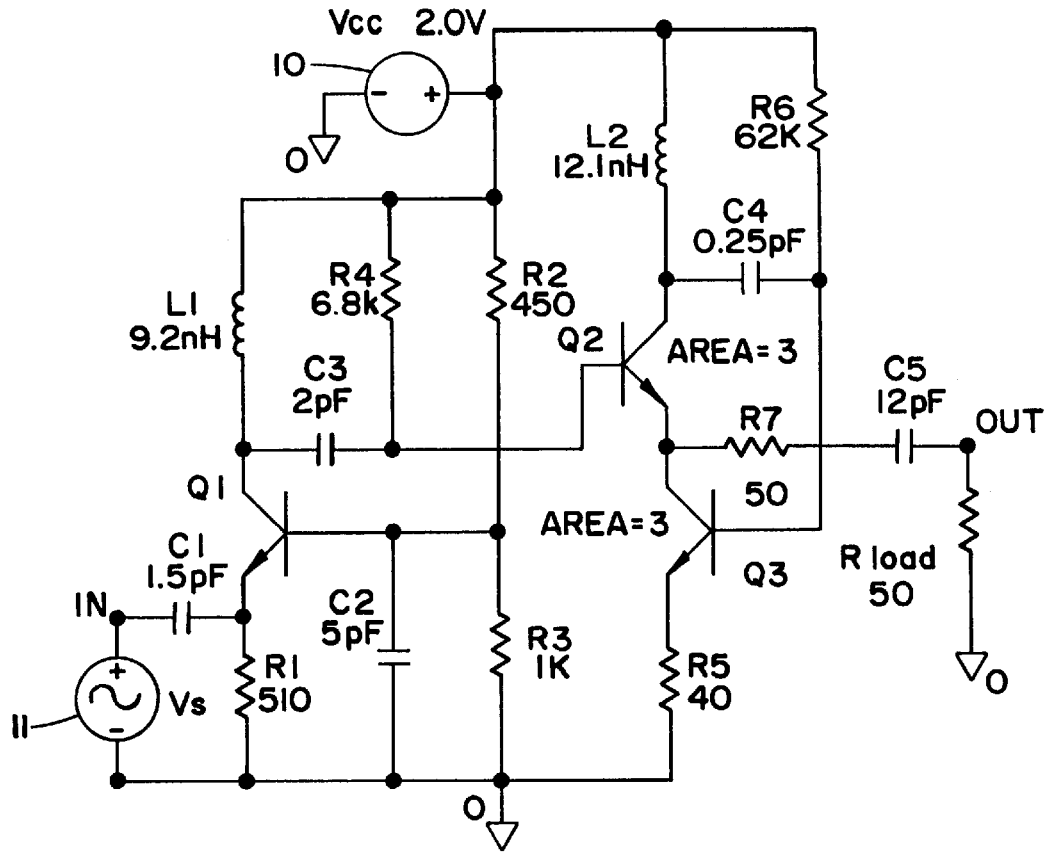
FIG. 1 shows a low noise amplifier circuit of the invention.

FIG. 1 shows a circuit diagram of an amplifier of the invention. A NPN bipolar transistor Q1 provides a common-base input stage. NPN transistors Q2 and Q3 provide an output stage of the type White's cascode. A collector of Q1 is connected via a coil a first side of to an operating voltage Vcc=2,0 V, which is obtained from a voltage source 10. An emitter of transistor Q1 is connected via an emitter resistor R1 to a second side of the operating voltage at a potential of 0 V (ground). A voltage divider, which is composed of a series connection of resistors R2 and R3, is connected between the first side of the operating voltage Vcc and 0 V for providing the biasing of the base circuit of Q1. For this purpose, the base of Q1 is connected to a point of connection between resistors R2 and R3. In addition, a grounding capacitor C2 is connected to ground (0 V) from the base of Q1. A signal source 11 generally represents the circuit from which the input signal of the amplifier is received. One terminal of the signal source 11 is connected to the ground terminal of the emitter resistor R1 and the other terminal via a coupling capacitor C1 to the emitter of Q1.

As explained in the BRIEF SUMMARY, the use of inductive components (L1, L2) in a collector circuit according to the invention provides designers with more flexibility in securing a high gain. This, again, indirectly provides more freedom for design; once being released from the need to produce a sufficient gain, the designer is more free to choose the emitter current to match with the low noise. A high temperature stability and a low noise are achieved by selecting a sufficiently high emitter resistance for resistor R1, and by employing a low-resistance divider (R2, R3) for producing the base bias current.

In the White's cascode, the collector of transistor Q2 is connected to the operating voltage Vcc via a coil L2. An emitter of Q2 is connected to a collector of transistor Q3, and via a resistor R7 and a coupling capacitor C5 to an output OUT. An emitter of transistor Q3 is connected to ground via a resistor R5. The base of Q2 is connected via a biasing resistor R4 to the operating voltage Vcc and via a coupling capacitor C3 to a collector of transistor Q3. The base of transistor Q3 is connected via a biasing resistor R6 to the operating voltage Vcc and via a capacitor C4 to a collector of transistor Q2. In FIG. 1, the load caused by the circuit into which the output is applied is illustrated with a resistor Rload.

The values of the components in FIG. 1 are illustrated by way of an example of one embodiment only, and to enable comparison with other prior art low noise amplifiers. It must be understood that the component values may vary a lot from one embodiment to another.

Figure 2:
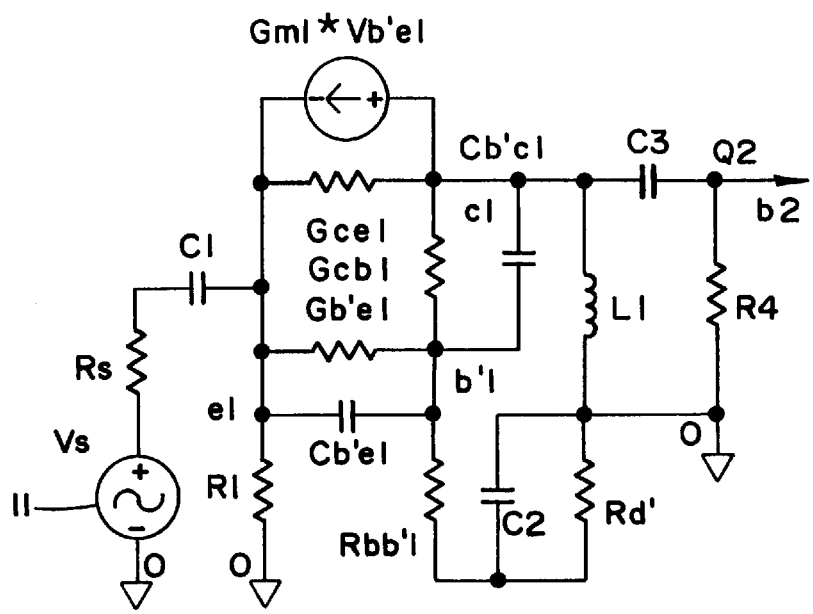
FIG. 2 shows a first stage AC equivalence circuit of the amplifier according to FIG. 1.

FIG. 2 shows an AC equivalence circuit of a common-base input stage of FIG. 1. In FIG. 2, the following abbreviations are used: $Gce1$ is the conductance of the base-emitter connection, $Gcb1$ is the conductance of the collector-base connection, $Gb'e1$ is the conductance between a nodal point b' and the emitter; $Cb'e1$ is the capacitance between the nodal point b' and the emitter; $Cb'c1$ is the capacitance between the nodal point b' and the collector; $Rbb'1$ is the resistance between the base and the nodal point b'; $Rd'$ is the resistance of the parallel connection of resistors R2 and R3; b' is the nodal point of the base; e1 is the nodal point of the emitter; $Gm1*Vb'e1$ is the power supply.

RS represents the characteristic impedance of the signal source 11, usually being 50 ohms. RS is connected via capacitor C1 to the input impedance of transistor Q1, said impedance being slightly inductive by nature. Since the source impedance RS and the input impedance are rather small, capacitor C1 must be sufficiently large in order to produce a sufficient time constant for them and to transfer the radio frequencies of interest. The same applies to capacitor C2, which provides the grounding of the common-base. It appears from FIG. 2 that C2 is connected in series with the input signal. Consequently, either the value of C1 or both values may be used for adjusting the level of the input signal, thus affecting the overall gain of the entire amplifier.

It also appears from the equivalence circuit of FIG. 2 that the common-base stage is loaded by the input impedances of an inductor L1 and that of the following stage (White's cascode) via the DC blocking capacitor C3. Coil L1 then provides a parallel LC resonance circuit with parasitic capacitors ($Cp'e1$, $Cp'C1$) of transistor Q1, mainly with $Cp'C1$, at a high resonance frequency. The following capacitor C3 provides an impedance transformer with the input capacitance of the White's cascode and thus increases the capacitance in parallel with coil L1. As a result, if the capacitance of capacitor C3 is low, the overall capacitance in parallel with coil L1 mainly consists of the parasitic capacitances of Q1, in which case the center frequency of the passband of the amplifier is high. Instead, if the capacitance of capacitor C3 is sufficiently high, it will bring additional capacitance to the overall capacitance in parallel with coil L1, which results in a far lower resonance frequency.

Furthermore, when the capacitance of capacitor C3 is higher, it provides a better RF energy transfer to the second stage (the White's cascode), which will result in a higher gain. Capacitor C3 may thus be used for affecting the overall gain of the entire amplifier and the center frequency simultaneously. On the other hand, the possibility to tune the gain independently by changing the capacitances C1 and/or C2 of the common-base stage may as well be used in order to produce precisely the overall gain required at the frequency selected by means of capacitor C3. In addition, a biasing resistor R4 of the White's cascode may be employed for tuning the bandwidth, said resistor being AC connected in parallel with coil L1. This in fact proves that a coil with a high Q factor in place of resistor R4 would not provide any better features.

The second stage is the White's cascode, enhanced by using a coil L2 with a low Q factor at the collector of the upper transistor. This coil L2 boosts the amplification in the local loop and brings the performance of the circuit a lot closer to the ideal follower, having a negative feedback of almost exactly 100%. This provides an output impedance of almost zero and makes this circuit an almost ideal output stage. The output may thus be obtained from a standard characteristic impedance (generally a resistance of 50 ohms). The biasing used assumes higher resistances (R6) and thus does not have any effect on the low Q factor of coil L2. Again, using a coil with a high Q factor would not significally increase the performance since its Q factor would be reduced as a result of the definite impedance of resistor R6 or of any other biasing circuit used. De-coupling capacitor C5 at the output may be an on-chip or an off-chip component.

The integrated monolithic low noise band-pass amplifier (LNA) according to FIG. 1 has been analyzed by means of 0.8 μm BiCMOS technology, where bipolar NPN transistors exhibit the maximum transient frequency $F_{TMAX}$ of 17 GHz, while the current passing through the transistor is about 800 μA. In this example, the current passing through the transistor in the first stage has been chosen as 500 μA, which is the current that produces the lowest noise.

The achieved amplification is 35 dB at the frequency of 3 GHz from a voltage supply of 2 volts. This is rather a high amplification value, although coil L1 possesses a relatively low Q factor, and it cannot be achieved using a two-volt voltage supply if a resistor is employed at the collector of Q1. Transistors Q2 and Q3 are three times larger in size than transistor Q1 in order to provide the output current required for low-resistance loads.

Coils L1 and L2 with a low Q factor enable pre-tuning of the center frequency within the range ±10% and independent pre-setting of the gain between 20 dB and 40 dB, which is not possible when prior art circuit configurations are employed.

Figure 3:
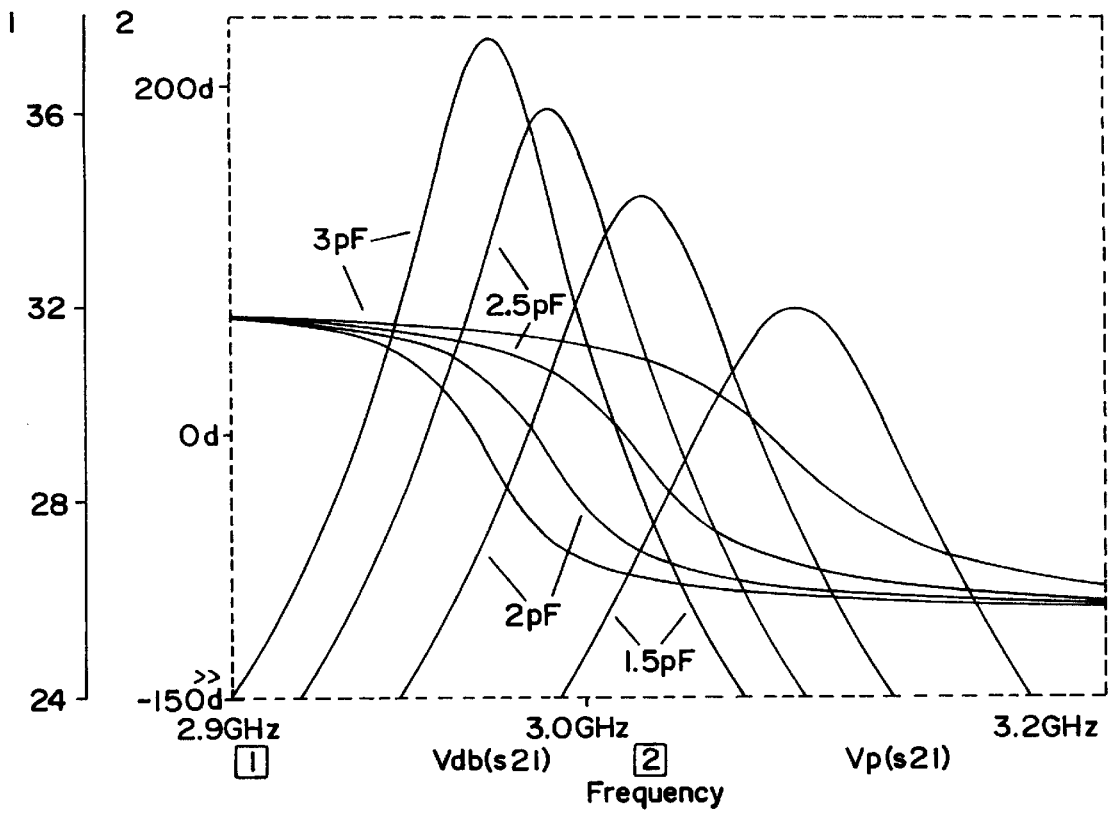
FIG. 3 is a diagram showing the effect of the frequency tuning on the s-parameter [s21] when the value of the capacitor C3 is changed.
Figure 4:
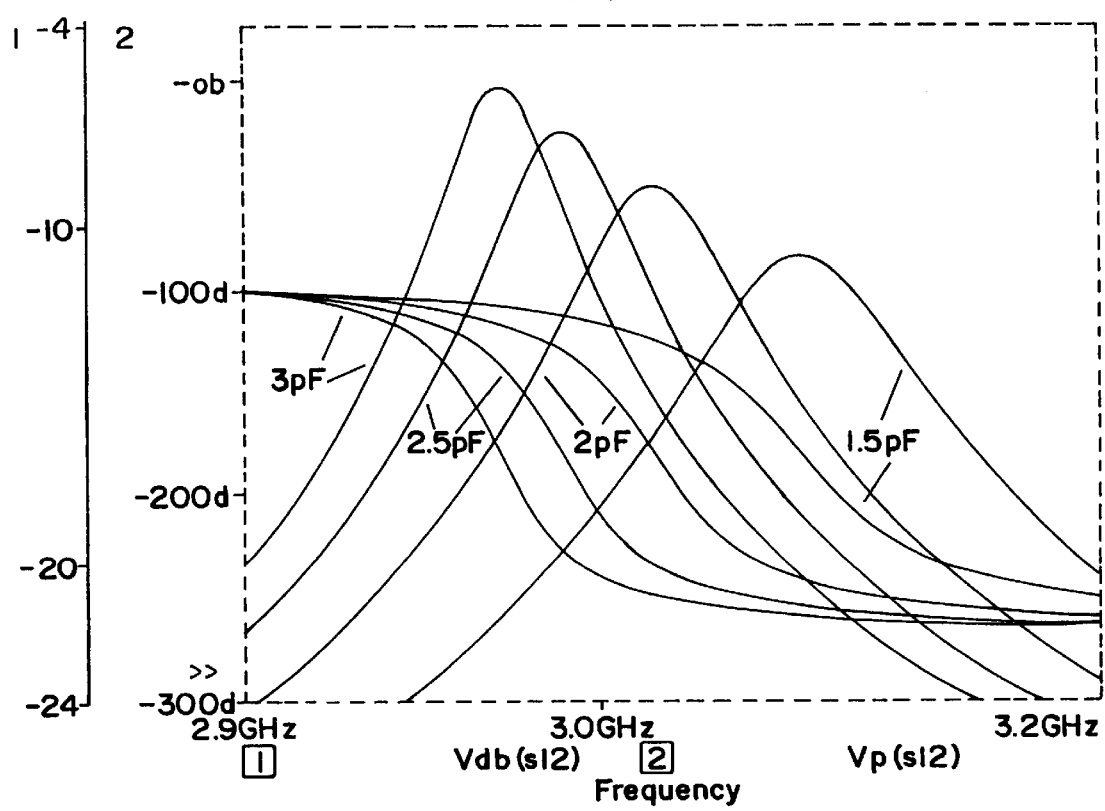
FIG. 4 is a diagram showing the effect of the frequency tuning on the s-parameter [s12] when the value of the capacitor C3 is changed.

The effect of selecting the frequency and simultaneous variations in the gain by varying the capacitance of capacitor C3 are illustrated in FIGS. 3 and 4 by means of S parameters $[s_{21}]$ and $[s_{12}]$.

Figure 5:
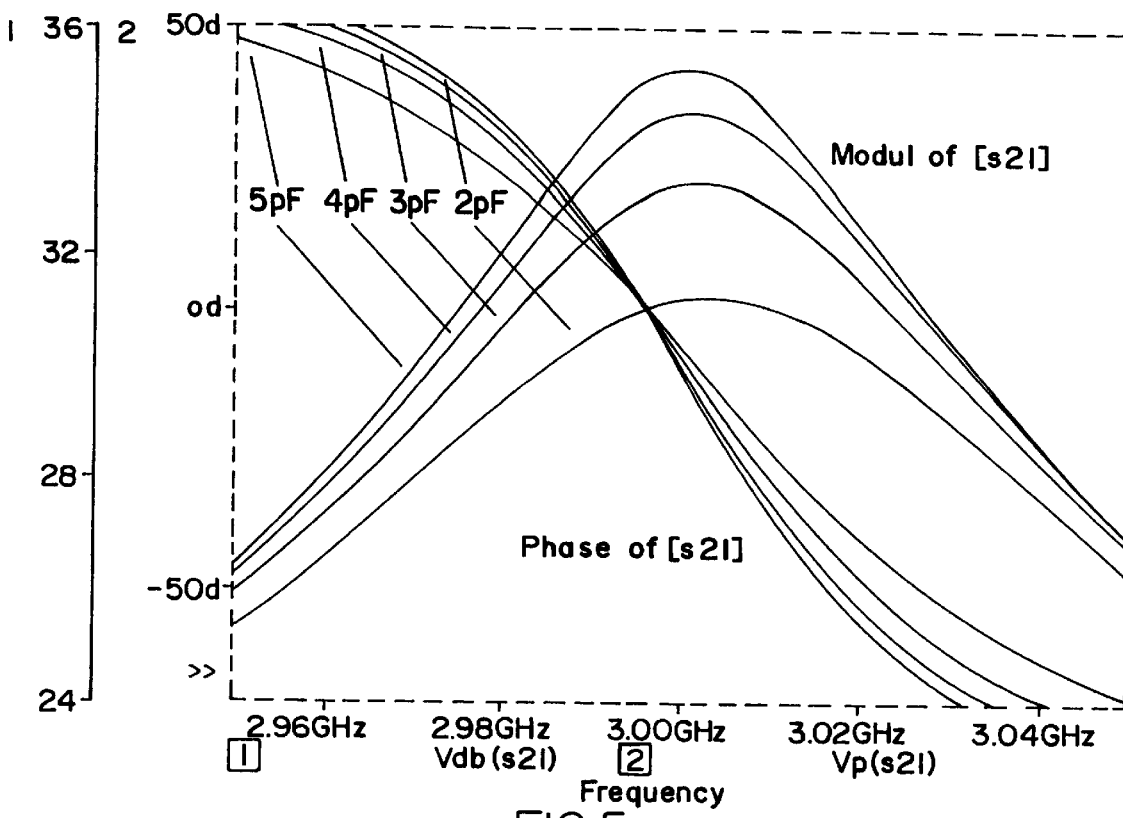
FIG. 5 is a diagram showing the effect of the frequency tuning on the s-parameter [s21] when the value of the capacitor C2 is changed.
Figure 6:
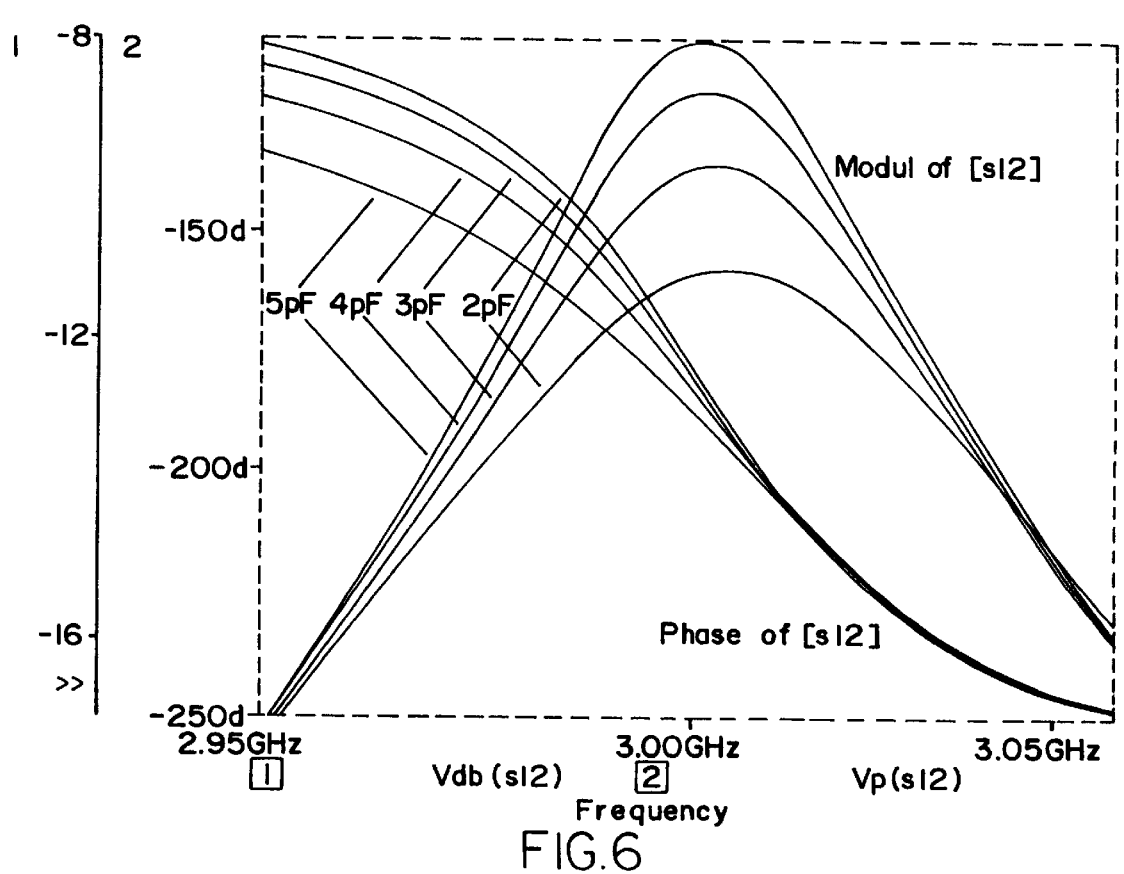
FIG. 6 is a diagram showing the effect of the frequency tuning on the s-parameter [s12] when the value of the capacitor C2 is changed.

Once the frequency has been selected, the overall gain may be determined by using capacitor C2, as illustrated in FIGS. 5 and 6.

As was expected, the inductive component of the common-base stage is relatively small. Thus, upon changing the value of capacitor C2, practically only the overall gain will change at an almost constant frequency.

The amplification can operate in the same way at least up to the frequency of 8 to 10 GHz using the same technology.

The power consumption of the amplifier circuit is only 8 mW from a two-volt power supply.

The circuit is suited for use e.g. as an amplifier-filter-buffer in various wireless communications units.

The figures and the explanation associated therewith are only intended to illustrate the present invention. The amplifier of the invention may vary in details within the scope of the appended claims.

We claim:

1. An amplifier, comprising:
    an input stage comprising a common-base connected amplifier transistor having a collector connected via a first inductive coil to a first side of the operating voltage potential, an emitter connected via an emitter resistor to a second side of the operating voltage potential and via a first coupling capacitor to the input of the amplifier, and a base connected via a grounding capacitor to the second side of the operating voltage potential, and
    a biasing circuit for biasing the common-base connected transistor;
    an output stage comprising a White's cascode, comprising,
        a first transistor having a collector connected via a second inductive coil to the operating voltage, an emitter connected via a second coupling capacitor to the output of the amplifier, and a base connected via a third coupling capacitor to the collector of the common-base connected transistor,
        a second transistor, having a collector connected to the emitter of the first transistor, and an emitter connected via a resistor to the other operating voltage potential,
        biasing circuits for biasing the first and the second transistors.

2. An amplifier as claimed in claim 1, wherein the overall gain and the center frequency of the amplifier are arranged to be tuned by changing the value of the third coupling capacitor.

3. An amplifier as claimed in claim 1, wherein the gain of the common-base connected stage is arranged to be tuned by changing the value of the first coupling capacitor and/or the grounding capacitor.

4. An amplifier as claimed in claim 1 or 2, wherein the noise level of the amplifier is arranged to be set substantially independently of the center frequency and the gain of the amplifier on the basis of the value of said emitter resistor.

5. An amplifier as claimed in any one of the claims 1, 2 or 3, wherein the biasing circuit of the first transistor comprises a biasing resistor which is connected between the base of the first transistor and the operating voltage and AC connected in parallel with the first inductive component, and the bandwidth of the common-base connected stage is arranged to be tuned by changing the value of the biasing resistor.

6. An amplifier as claimed in claim 1, wherein the amplifier is carried out as an integrated circuit and the first and the second inductive coils are on-chip coils having a low Q factor.

* * * * *